US008653818B2

(12) United States Patent
Adalsteinsson et al.

(10) Patent No.: US 8,653,818 B2
(45) Date of Patent: Feb. 18, 2014

(54) PARALLEL TRANSMISSION RF PULSE DESIGN WITH LOCAL SAR CONSTRAINTS

(75) Inventors: Elfar Adalsteinsson, Belmont, MA (US); Joonsung Lee, Gwang-ju (KR); Lawrence L. Wald, Cambridge, MA (US); Matthias L. Gebhardt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 313 days.

(21) Appl. No.: 13/083,342

(22) Filed: Apr. 8, 2011

(65) Prior Publication Data

US 2012/0256626 A1    Oct. 11, 2012

(51) Int. Cl.
G01V 3/00    (2006.01)
(52) U.S. Cl.
USPC .......................................... 324/309; 324/307
(58) Field of Classification Search
USPC ............................ 324/300–322; 600/407–445
See application file for complete search history.

(56) References Cited

U.S. PATENT DOCUMENTS

| | | | | |
|---|---|---|---|---|
| 6,989,673 | B2* | 1/2006 | Zhu | 324/318 |
| 7,075,301 | B2* | 7/2006 | Zhu | 324/318 |
| 7,385,496 | B2* | 6/2008 | Ogino et al. | 340/506 |
| 7,603,157 | B2 | 10/2009 | Feiweier et al. | |
| 8,148,985 | B2* | 4/2012 | Zelinski et al. | 324/309 |
| 2010/0134105 | A1 | 6/2010 | Zelinski et al. | |
| 2010/0308825 | A1 | 12/2010 | Brinker et al. | |
| 2010/0327868 | A1 | 12/2010 | Gebhardt et al. | |
| 2011/0224924 | A1 | 9/2011 | Eichfelder et al. | |
| 2011/0254545 | A1* | 10/2011 | Gebhardt et al. | 324/307 |
| 2013/0063143 | A1* | 3/2013 | Adalsteinsson et al. | 324/307 |
| 2013/0134975 | A1* | 5/2013 | Nehrke et al. | 324/309 |

OTHER PUBLICATIONS

Alagappan et al., "Degenerate Mode Band-Pass Birdcage Coil for Accelerated Parallel Excitation," Magnetic Resonance in Medicine 57, pp. 1148-1158, 2007.
Christ et al., "The Virtual Family—Development of Surface-Based Anatomical Models of Two Adults and Two Children for Dosimetric Simulations," Physics in Medicine and Biology 55, pp. N23-N38, 2010.
Gebhardt et al., "Evaluation of Maximum Local SAR for Parallel Transmission (pTx) Pulses Based on Pre-Calculated Field Data using a Selected Subset of Virtual Observation Points," ISMRM, 1 page, 2010.
Grissom et al. "Spatial Domain Method for the Design of RF Pulses in Multicoil Parallel Excitation," Magnetic Resonance in Medicine 56, pp. 620-629, 2006.
Gumbrecht et al., "Fast High-Flip pTx Pulse Design to Mitigate B1+ Inhomogeneity Using Composite Pulses at 7T.," ISMRM, 1 page, 2010.

(Continued)

*Primary Examiner* — Brij Shrivastav
(74) *Attorney, Agent, or Firm* — Lempia Summerfield Katz LLC

(57) ABSTRACT

A method of designing a parallel transmission radio frequency (RF) pulse for a magnetic resonance imaging (MRI) system includes compressing a model for a subject to be scanned by the MRI system into a plurality of voxel clusters, each voxel cluster defining a virtual observation point with a peak sensitivity to local specific absorption rate (SAR) for the voxel cluster, and defining the parallel transmission RF pulse based on an approximation of a minimization criterion having a local SAR component based on the peak sensitivity of each virtual observation point, the approximation comprising a weighted sum of the local SAR values for each virtual observation point.

26 Claims, 11 Drawing Sheets

(56) References Cited

OTHER PUBLICATIONS

Setsompop et al., "Parallel RF Transmission with Eight Channels at 3 Tesla," Magnetic Resonance in Medicine 56, pp. 1163-1171, 2006.
Setsompop et al., "High-Flip-Angle Slice-Selective Parallel RF Transmission with 8 Channels at 7 Tesla," J Magn Reson 195(1), pp. 76-84, Nov. 2008.
Setsompop et al., "Magnitude Least Squares Optimization for Parallel Radio Frequency Excitation Design Demonstrated at 7 Tesla With Eight Channels," Magnetic Resonance in Medicine 59, pp. 908-915, 2008.
Setsompop et al., "Slice-Selective RF Pulses for In Vivo B1+ Inhomogeneity Mitigation at 7 Tesla Using Parallel RF Excitation With a 16-Element Coil," Magnetic Resonance in Medicine 60, pp. 1422-1432, 2008.
Setsompop et al., "Broadband Slab Selection with B+1 Mitigation at 7T via Parallel Spectral-Spatial Excitation," Magnetic Resonance in Medicine 61, pp. 493-500, 2009.
Katscher U, et al., "Transmit SENSE," Magn Reson Med, vol. 49, pp. 144-150 (2003).
Ullmann P, et al., "Experimental Analysis of Parallel Excitation Using Dedicated Coil Setups and Simultaneous RF Transmissions on Multiple Channels," Magn Reson Med, vol. 54, pp. 994-1001 (2005).
Wiggins G, et al., "A Close-Fitting 7 Tesla 8 Channel Transmit-Receive Helmet Array With Dodecahedral Symmetry and B1 Variation Along Z," In: Proceedings of the International Society for Magnetic Resonance in Medicine, Toronto, Canada; pp. 148 (2008).
Zhu, Y, et al., "Parallel Excitation with an Array of Transmit Coils," Magn Reson Med, vol. 51, pp. 775-784 (2004).
Voigt T, et al., "Imaging Conductivity and Local SAR of the Human Brain," In: Proceedings of the International Society for Magnetic Resonance in Medicine, Honolulu, Hawaii; pp. 4531 (2009).
Cloos MA, et al., "Towards Direct B1 Based Local SAR Estimation," In: Proceedings of the International Society for Magnetic Resonance in Medicine, Honolulu, Hawaii, pp. 3037 (2009).
Collins, CM, et al., "SAR and B1 Field Distribution in a Heterogeneous Human Head Model with a Birdcage Coil. Specific Energy Absorption Rate," Magn Reson Med, vol. 40 (847-856 (1998).
Collins CM, et al., "Calculations of B1 Distribution, SNR, and SAR for a Surface Coil Adjacent to an Anatomically-Accurate Human Body Model," Mag Reson Med, vol. 45 pp. 692-699 (2001).
Xu D, et al., "Designing Multi-Channel, Multi-Dimensional, Arbitrary Flip Angle RF Impulses Using an Optimal Control Approach," Magn Reson Med, vol. 59 pp. 547-560 (2008).
Xu, D, et al., "A Noniterative Method to Design a Large-Tip Angle Multi-Dimensional Spatially-Selective Radio Frequency Pulses for Parallel Transmission," Magn Reson Med, vol. 58, pp. 326-334 (2007).
Mao W, et al., "Exploring the Limits of RF Shimming for High-Field MRI of the Human Head," Magn Reson Med, vol. 56, pp. 918-922 (2006).
Grissom WA, et al., "Fast Large-Tip Angle Multidimensional and Parallel RF Pulse Design in MRI," IEEE Trans Med Imaging, vol. 28, pp. 1548-1559 (2009).
Zhu Y, et al., "In Vivo RF Power and SAR Calibration for Multi-Port RF Transmission," In: Proceedings of the International Society for Magnetic Resonance in Medicine, Honolulu, Hawaii; 2009. p. 599.
Brunner DO, et al., "Optimal Design of Multi-Channel RF Pulses Under Strict Power and SAR Constraints," Magn Reson Med, vol. 63, pp. 1280-1291 (2010).
Graesslin, IS, et al., "Local SAR Constrained Hotspot Reduction by Temporal Averaging," In: Proceedings of the International Society for Magnetic Resonance in Medicine, Stockholm, Sweden, pp. 4932 (2010).
Graesslin, IS, et al., "A Minimum SAR RF Pulse Design Approach for Parallel Tx with Local Hot Spot Suppression and Exact Fidelity Constraint," In: Proceedings of the International Society for Magnetic Resonance in Medicine, Toronto, Canada, pp. 621 (2008).
Cloos MA, et al., "Local SAR Reduction in Parallel Excitation Based on Channel-Dependent Tikhonov Parameters," J Magn Reson Imaging, vol. 32, pp. 1209-1216 (2010).
Hoult, DI, et al., "Sensitivity and Power Deposition in a High-Field Imaging Experiment," J Magn Reson Imaging, vol. 12, pp. 46-67 (2000).
Ibrahim TS, et al., "Application of Finite Difference Time Domain Method for the Design of Bird-Cage RF Head Coils Using Multi-Port Excitations," Magn Reson Imaging, vol. 18, pp. 733-742 (2000).
Ulloa JL, et al., "Exploring 3D RF Shimming for Slice Selective Imaging," In: Proceedings of the International Society for Magnetic Resonance in Medicine Miami Beach, Florida, p. 21(2005).
Saekho S, et al., "Fast-Kz Three-Dimensional Tailored Radio Frequency Pulse for Reduced B1 Inhomogeneity," Magn Reson Med, vol. 55, pp. 719-724 (2006).
Pauly J, et al., "A K-Space Analysis of Small-Tip Angle Excitation," J Magn Reson Med, vol. 81, pp. 43-56 (1989).
Eichfelder G, et al., "Local Specific Absorption Rate Control for Parallel Transmission by Virtual Observation Points," Magn Reson Med (2011).
Graesslin I, et al., "SAR Hotspot Reduction by Temporal Averaging in Parallel Transmission," In: Proceedings of the International Society for Magnetic Resonance in Medicine, Honolulu, Hawaii, pp. 3037 (2009).
Seifert, F, et al., "Patient Safety Concept for Multichannel Transmit Coils," J Magn Reson. Imag., vol. 26, pp. 1315-1321 (2007).
Katscher, U. et al., "Parallel RF Transmission in MRI." NMR Biomed, vol. 19, pp. 393-400 (2006).
Chen Lin et al., "Reduction of RF Power for Magnetization Transfer With Optimized Application of RF Pulses in k-Space," Magnetic Resonance in Medicine, vol. 50, pp. 114-121 (2003).
Adam Charles Zelinski, "Improvements in Magnetic Resonance Imaging Excitation Pulse Design," Thesis document, pp. 1-253 (2008).
Adam C. Zelinski et al., "Specific Absorption Rate Studies of the Parallel Transmission of Inner-Volume Excitations at 7T," Journal of Magnetic Resonance Imaging, vol. 28, pp. 1005-1018 (2008).

* cited by examiner

PARALLEL TRANSMISSION RF PULSE DESIGN WITH LOCAL SAR CONSTRAINTS

STATEMENT REGARDING FEDERALLY SPONSORED RESEARCH OR DEVELOPMENT

This invention was made with government support under Research Grant Program (R01) Contract Nos. EB007942 and EB006847 awarded by the National Institutes of Health (NIH). The government has certain rights in the invention.

FIELD

The disclosure relates generally to magnetic resonance imaging (MRI) systems and, more particularly, to designing parallel transmission RF pulses for use in MRI systems.

BACKGROUND

Magnetic resonance imaging (MRI) is a medical imaging technique in widespread use for viewing the structure and function of the human body. MRI systems provide soft-tissue contrast, such as for diagnosing many soft-tissue disorders. MRI systems generally implement a two-phase method. The first phase is the excitation phase, in which a magnetic resonance signal is created in the subject. To that end, the body being examined is subjected to a main magnetic field, $B_0$, to align the individual magnetic moments, or spins, of the nuclei in the tissue with the axis of the polarizing field (conventionally, the z-axis). The main magnetic field also causes the magnetic moments to resonantly precess about the axis at their characteristic Larmor frequency. If the tissue is then subjected to a radio frequency (RF) excitation pulse, $B_1$, with a frequency near the Larmor frequency, a magnetic field in the x-y plane re-orients, flips, or tips the net aligned moment, $M_z$, into or toward the x-y plane, producing a net transverse magnetic moment $M_{xy}$, the so-called spin magnetization. The second phase is the acquisition phase, in which the system receives an electromagnetic signal emitted as the excited nuclei relax back into alignment with the z-axis after the excitation pulse $B_1$ is terminated. These two phases are repeated pair-wise to acquire enough data to construct an image.

The excitation phase is generally tailored to localize the excitation pulse to a specific region within the subject, such as a 3D slab or a relatively thin 2D slice. The subsequent acquisition phase encodes the localized region in all three dimensions for a 3D slab or only in-plane for a thin slice. Typically, the region to be imaged is scanned by a sequence of measurement cycles in which magnetic field gradients ($G_x$, $G_y$, and $G_z$) vary according to the particular localization method being used. Tailored RF pulses are also used to localize the excitations. Scan sequences containing these RF pulses and gradients are stored in a library accessed by commercial MRI scanners operating at a main magnetic field strength of 1.5 Tesla or lower to meet the needs of many different clinical applications.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

Most MRI scanners use a single-channel RF excitation coil to tip the spin magnetization away from its equilibrium state and initiate a measurement cycle. Usually, a radio frequency ("RF") excitation pulse is used to excite either all of the spins inside the excitation coil (non-selective excitation), a single slice through the subject (slice-selective excitation), or within only a specific region, such as, a small cube (3-D spatially-selective excitation). In spatially-selective, spatially-tailored excitation, the RF pulse is transmitted in the presence of gradient waveforms that impart a time-varying gradient onto the main magnetic field of the MRI system, which is instrumental in the spatial and selective excitation process. In general, the gradient field may be viewed as causing the traversal of a curve in excitation k-space, a path that may proceed through all three dimensions of k-space ($k_x$, $k_y$, and $k_z$), which under certain assumptions is essentially a 3-D Fourier domain. During this traversal of excitation k-space, the energy of the RF pulse being played in conjunction with the gradient waveforms may be viewed as depositing RF energy along this k-space excitation trajectory curve. The RF pulse thus produces an excitation that modulates (in phase, in amplitude, or both) as a function of position ($k_x$, $k_y$, and $k_z$) in excitation k-space. The resulting excitation is often closely related to the inverse Fourier transform of this deposited energy.

For example, in a typical slice-selective RF pulse, a constant gradient field is applied in the z-direction while an RF pulse shaped like a sine cardinal ("sinc") function is transmitted through the MRI system's single excitation coil. In this instance, the gradient field causes the RF pulse energy to be deposited along a single line (a "spoke") in the $k_z$-direction of excitation k-space, that is, a line through the k-space position $(0,0,k_z)$. This sine-like deposition in $k_z$ excites only those magnetic spins within a thin slice of tissue due to the Fourier relationship between energy deposited in excitation k-space and the flip angle of the resulting magnetization. In short, the magnetization that results from this typical RF pulse is a constant degree of excitation within the slice and no excitation out of the slice.

Higher magnetic field strength scanners have been recently used to improve image signal-to-noise ratio and contrast. However, a spatial variation in the magnitude of the RF excitation magnetic field, $B_1^+$, occurs with main magnetic field strengths of, for example, 7 Tesla. This undesirable non-uniformity in the excitation across the region of interest is commonly referred to as "center brightening," "$B_1^+$ inhomogeneity" or "flip angle inhomogeneity."

Newer-generation MRI systems have generated RF pulses with a spatially tailored excitation pattern to mitigate $B_1^+$ inhomogeneity by exciting a spatial inverse of the inhomogeneity. In these systems, a plurality of individual radio-frequency pulse trains are transmitted in parallel over the different independent radio-frequency transmit channels.

Individual RF signals are then applied to the individual transmit channels, e.g., the individual rods of a whole-body antenna. This recent method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes.

A number of methods have been proposed for the design of the RF and gradient waveforms for parallel excitation, such as those disclosed, for example, by U. Katscher, et al., in "Transmit SENSE," Magnetic Resonance in Medicine, Vol. 49, p. 144-150 (2003); by Y. Zhu in "Parallel Excitation with an Array of Transmit Coils," Magnetic Resonance in Medicine, Vol. 51, p. 775-784 (2004); by M. Griswold, et al., in "Autocalibrated Accelerated Parallel Excitation (Transmit-GRAPPA)," Proceedings of the 13th Annual Meeting of ISMRM, p. 2435 (2005); and by W. Grissom, et al., in "Spatial Domain Method for the Design of RF Pulses in Multicoil Parallel Excitation," Magnetic Resonance in Medicine, Vol. 56, p. 620-629 (2006).

Successful implementations have been demonstrated on multi-channel hardware, including those described by P. Ullmann, et al., in "Experimental Analysis of Parallel Excitation Using Dedicated Coil Setups and Simultaneous RF Transmission on Multiple Channels," Magnetic Resonance in Medicine, Vol. 54, p. 994-1001 (2005); by D. Xu, et al., in "A Noniterative Method to Design Large-Tip-Angle Multidimensional Spatially-Selective Radio Frequency Pulses for Parallel Transmission," Magnetic Resonance in Medicine, Vol. 58, p. 326-334 (2007); and by P. Vernickel, et al., in "Eight-Channel Transmit/Receive Body MRI Coil at 3T," Magnetic Resonance in Medicine, Vol. 58, p. 381-389 (2007).

Spatially-tailored excitations using parallel transmission methods are designed to provide a prescribed excitation pattern at the Larmor frequency of a specific spin species. As such, the parallel transmission of RF excitation pulses in the presence of two-dimensional (2D) and three-dimensional (3D) gradient trajectories offers a flexible means for volume excitation and the mitigation of inhomogeneity in the main magnetic field, $B_0$, and the excitation field, $B_1^+$. Parallel transmission systems are adept at these tasks because their RF excitation arrays include multiple independent transmission elements with unique spatial profiles that may be modulated and superimposed to tailor the magnitude and phase of the transverse magnetization across a chosen field-of-excitation (FOX). Parallel transmission systems allow reduction of the duration of an RF pulse by increasing the amplitude and slew rates of the system's gradient coils. Namely, the excitation k-space trajectory may be undersampled (reducing the distance traveled in k-space), in turn shortening the corresponding RF pulse. The ability to "accelerate" in the k-space domain arises due to the extra degrees of freedom provided by the system's multiple transmit elements.

Unfortunately, parallel transmission techniques generally increase peak pulse power, giving rise to concerns regarding excessive exposure to RF energy. In this context, the RF exposure is generally directed to a physiological absorption of the RF irradiation, rather than the transmitted RF energy. A typical measure of the radio-frequency absorption is the specific absorption rate, or SAR, which specifies the deposited power per unit weight (watts/kg) due to the RF pulse. Maximum values for SAR are specified by safety regulations and should be met both globally (e.g., power absorbed by the whole head or whole body) and locally (e.g., power absorbed per 10 grams of tissue). For example, a standardized limit of 4 watts/kg applies to the global SAR of a patient according to an IEC (International Electrotechnical Commission) standard.

When multiple transmit channels are simultaneously employed, the local electric fields generated by each channel undergo local superposition, and local extremes in electric field magnitude may arise, leading to spikes in local SAR. Recent studies have confirmed the presence of "hot spots" and found that parallel transmitted pulses produce relatively high ratios of local to whole-head average SAR, as is described by, for example, F. Seifert et al., in "Patient Safety Concept for Multichannel Transmit Coils," J Magn. Reson. Imag., 26:1315-1321 (2007). These relatively-high ratios of local to whole-head average SAR make local SAR the limiting factor of parallel transmission MRI. Concerns regarding elevated SAR levels are also set forth in U. Katscher and P. Bornert in "Parallel RF Transmission in MRI." NMR Biomed, 19:393-400 (2006).

One technique for SAR reduction involves placing constraints on global and local SAR. In this method, SAR constraints are explicitly built into the pulse design process. Because both whole-head mean SAR and local N-gram SAR at any location can be expressed quadratically in terms of pulse sample values, constraints on both whole-head and local SAR can be incorporated simply by adding quadratic constraints to the design method. For example, the method described by I. Graesslin, et al., in "A Minimum SAR RF Pulse Design Approach for Parallel Tx with Local Hot Spot Suppression and Exact Fidelity Constraint," Proc. Intl. Soc. Magn. Reson. Med., 2008; 612, explicitly accounts for global SAR as well as local SAR at several spatial locations by incorporating several quadratic constraints into the design. However, this approach presents the computationally-intractable problem of solving a system of equations with tens of thousands (or millions) of quadratic constraints.

SUMMARY

In accordance with one aspect, a method is provided for a parallel transmission radio frequency (RF) pulse for a magnetic resonance imaging (MRI) system. The method includes compressing a model for a subject to be scanned by the MRI system into a plurality of voxel clusters, each voxel cluster defining a virtual observation point with a peak sensitivity to local specific absorption rate (SAR) for the voxel cluster. The method further includes defining the parallel transmission RF pulse based on an approximation of a minimization criterion having a local SAR component based on the peak sensitivity of each virtual observation point, the approximation including a weighted sum of local SAR values for the virtual observation points.

In one embodiment, the model includes a number of voxels, and compressing the model includes calculating a spatial matrix for each voxel of the model, the spatial matrix being indicative of absorption sensitivity. Compressing the model may further include defining an upper bound matrix for each virtual observation point as a sum of the spatial matrix of the virtual observation point and a unit matrix scaled by an overestimation factor that tunes the compressing step. In some cases, the minimization criterion may then include a component indicative of total power of the parallel transmission RF pulse scaled by the overestimation factor. The method may then further include selecting the overestimation factor. Alternatively or additionally, compressing the model may include evaluating an eigenvalue of a spatial matrix for each voxel of the model, the spatial matrix being indicative of absorption sensitivity.

In one embodiment, defining the parallel transmission RF pulse includes iterating the approximation of the minimization criterion. The approximation of the minimization criterion may be based on a set of weighting factors. Each weighting factor may then be applied to the peak sensitivity of a respective one of the virtual observation points. Alternatively or additionally, defining the parallel transmission RF pulse may include updating the set of weighting factors based on local SAR values of the virtual observation points for a given RF pulse and a predicted direction that increases the local SAR values.

In accordance with another aspect, a method is provided for a parallel transmission radio frequency (RF) pulse for a magnetic resonance imaging (MRI) system and a model for a subject to be scanned by the MRI system, the model being defined via a number of voxels. The method includes calculating a spatial matrix for each voxel of the model, the spatial matrix being indicative of absorption sensitivity, defining a plurality of clusters of the voxels in the model, each cluster having a virtual observation point representing a maximum sensitivity to local specific absorption rate (SAR) for each voxel in the cluster, and selecting the parallel transmission RF pulse that minimizes an approximation of a design criterion having a local SAR component based on the peak sensitivity of each virtual observation point, the approximation comprising a weighted sum of local SAR values for the virtual observation points.

In accordance with yet another aspect, a magnetic resonance imaging (MRI) system includes a data storage unit to store calibration data for a model for a subject to be scanned, the model having a number of voxels, a coil array for transmitting a parallel transmission radio frequency (RF) pulse to the subject, and a control system in communication with the data storage unit and the coil array. The control system is configured to provide the parallel transmission RF pulse to control local specific absorption rate (SAR) based on the model, a model compression in which the model is compressed into a plurality of clusters of the voxels of the model, each cluster defining a virtual observation point with a peak sensitivity to local SAR for the voxel cluster, and an approximation of a design criterion having a local SAR component based on the peak sensitivity of each virtual observation point, the approximation comprising a weighted sum of local SAR values for the virtual observation points.

DETAILED DESCRIPTION OF THE DRAWINGS

Figure 1:
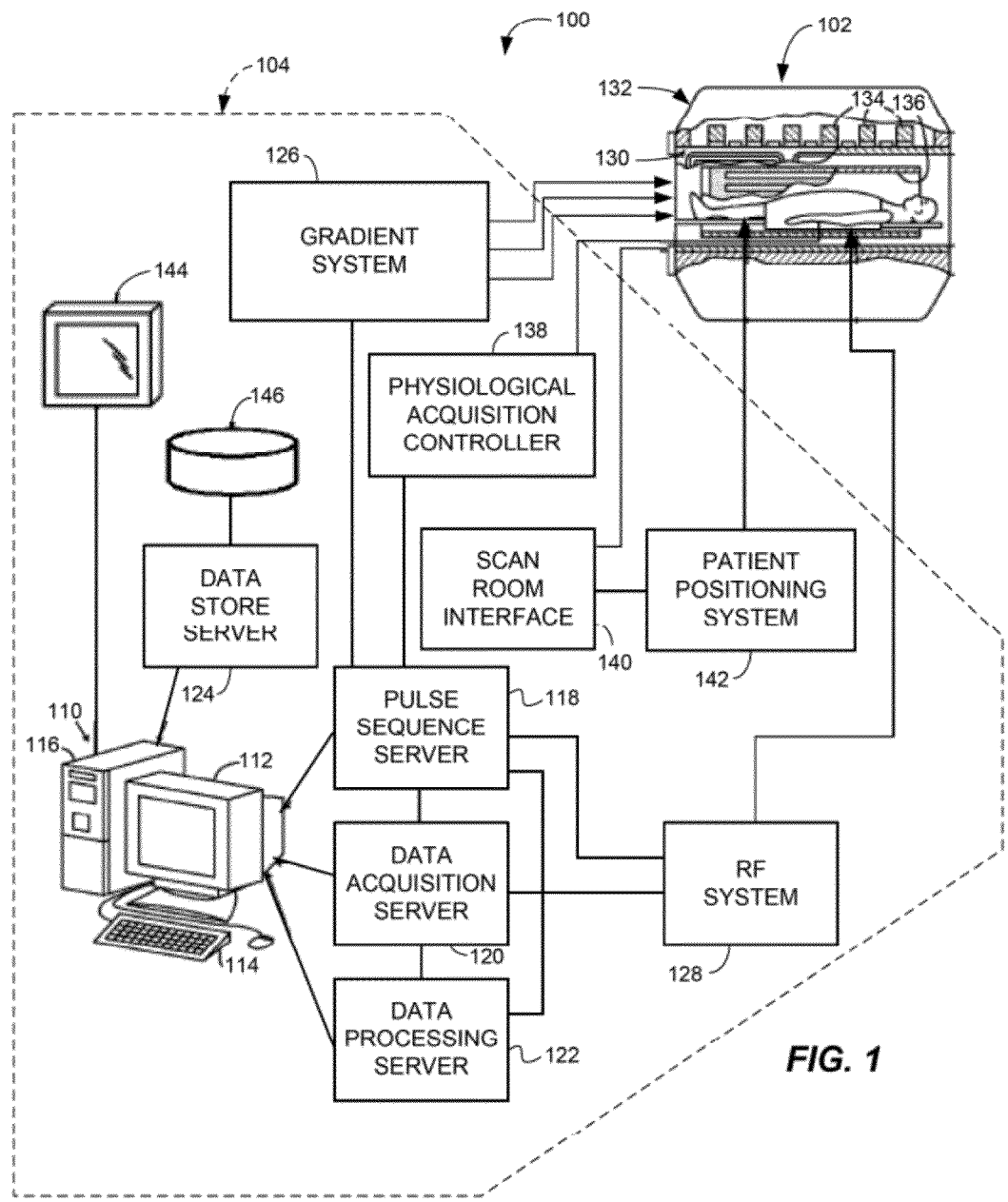
FIG. 1 is a block diagram of one embodiment of a magnetic resonance imaging (MRI) system configured in accordance with several aspects of the disclosure.

Parallel transmission RF pulses are desired, used, and/or stored for magnetic resonance imaging (MRI) scans. Systems and methods described below are directed to fast RF pulse design for minimizing or controlling local specific absorption rate (SAR) levels resulting from the application of parallel transmission RF pulses. With the disclosed systems and methods, local-SAR constrained, parallel transmission RF pulses can be designed, stored, and/or used on-the-fly in a time frame suitable for clinical use while remaining capable of achieving flexibly shaped excitation volumes for mitigating spatial inhomogeneities and other purposes. The RF pulses designed by the disclosed systems and methods are, thus, specific or tailored to each subject.

Parallel transmission (pTx) systems for radio frequency (RF) pulses in magnetic resonance imaging (MRI) can generate more flexible magnetization profiles than is feasible with conventional single-channel RF systems. Parallel transmission (pTx) systems are generally limited by SAR constraints. While global or average SAR values are readily measured and easily amenable to incorporation as constraints in the pTx RF pulse design, local SAR minimization during the design of pTx RF pulses poses a challenging problem. That local SAR is generally not measurable is only part of the problem. The significant challenge is that local SAR estimation resolution in segmented tissue models constitutes an optimization problem with a heavy computational burden. An exhaustive search for the single RF pulse design that minimizes local SAR for a given patient is not feasible given the length of time that the patient would be forced to wait during a scan sequence. Calculating local SAR for every voxel for every possible pTx RF pulse may preclude the real-time, or on-the-fly, design of the pTx RF pulse.

In contrast, the disclosed systems and methods enable the RF pulses to be designed in real-time, or on-the-fly, for a specific subject, in the sense that the RF pulses can be defined in a time frame reasonable for a subject remaining in the scanner after one or more preparation or calibration scans. A reasonable time frame may, for instance, be on the order of tens of seconds or perhaps one or two minutes. In this way, the disclosed systems and methods do not introduce overly burdensome delays for the subject.

The disclosed pulse design systems and methods address the challenge presented by the varied distribution of the parallel transmission signals superimposing inside the body. As a result of the multiple (N) channels in the transmission system, many potentially important locations are to be considered for local SAR evaluation rather than just one fixed hot spot. These challenges notwithstanding, the disclosed systems and methods efficiently and effectively incorporate local SAR constraints into the pTx RF pulse design, while remaining capable of mitigating spatial flip angle inhomogeneities. The local-SAR-constrained design may decrease local SAR by 15-40% relative to conventional pTx design with only an average SAR constraint.

Generally speaking, the disclosed systems and methods implement a model compression technique to determine the voxels with the maximum local SAR (the so-called hot spot candidates) to decrease the complexity of the prediction of the local SAR calculations. The disclosed systems and methods effectively capture the regions of large local SAR via this model compression to thereby enable the incorporation of the local SAR constraints into the RF pulse design. The model compression technique generally assigns each voxel of a patient-specific model into in clusters based on the sensitivity of each voxel to absorption, as represented by a pre-calculated, spatial matrix S for the model. The model compression technique then finds an upper bound matrix $A_j$ for each cluster j such that $A_j \geq S_{v,Ngram}$ is fulfilled for all voxels with spatial matrices S that belong to the cluster j. Each matrix $A_j$ can be seen as a Virtual Observation Point that represents all of the voxels in the cluster. The local SAR in the whole cluster will not exceed the local SAR predicted by This set of Virtual Observation Points can be used to reasonably predict and control the maximum local SAR, despite the small size of the set relative to the total number of voxels in the model. The SAR model compression beneficially incorporates local SAR optimization into the RF pulse design, by comprehensively but efficiently comparing local SAR properties of different simulation models and accelerating the local SAR evaluation of RF pulses.

The disclosed systems and methods also implement an approximation of a minimization criterion based on the model compression into the virtual observation points. The minimization criterion generally includes a component indicative of maximum local SAR based on the peak sensitivity of each cluster. The approximation generally uses a set of weighting factors to represent the local SAR component to convert a maximum norm constraint for the local SAR component into a weighted two norm power constraint, which is a computationally feasible condition.

Turning now to the drawing figures, FIG. 1 depicts a magnetic resonance imaging ("MRI") system 100 configured in accordance with several aspects of the disclosure. The MRI system 100 generally includes a scanner or data acquisition unit 102 and a control system 104 for directing the operation of the scanner 102. The control system 104, in turn, includes a workstation 110 having one or more output interfaces (e.g., display) 112 and one or more input interfaces (e.g., keyboard) 114. The workstation 110 includes a processor 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers, including, in this example, a pulse sequence server 118, a data acquisition server 120, a data processing server 122, and a data store server 124. The workstation 110 and the servers 118, 120, 122 and 124 may communicate with each other via any desired communication technique, protocol, or standard. The components of the control system 104 may be coupled to one another via a data bus or network (not shown) and need not be connected via respective, dedicated communication lines as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The pulse sequence server 118 functions in response to instructions downloaded from the workstation 110 to operate a gradient system 126 and a radio frequency ("RF") system 128. Gradient waveforms to perform the prescribed scan are produced and applied to the gradient system 126 that excites gradient coils in a gradient coil assembly 130 to produce the magnetic field gradients $G_x$, $G_y$, and $G_z$ used for position-encoding MR signals. The gradient coil assembly 130 forms part of a magnet assembly 132 that includes an annular or other polarizing magnet 134 and a whole-body RF coil array 136. In some cases, the whole-body RF coil array 136 is constructed in the form of a so-called birdcage antenna and has a number of individual antenna rods which run parallel to the patient tunnel and uniformly distributed in a circumferential arrangement around the patient tunnel. The individual antenna rods may be capacitively coupled to one another in a ring shape at one end of the birdcage antenna. A depiction of an exemplary birdcage antenna is shown in connection with the SAR calculation technique described in U.S. Patent Publication No. 2010/0327868 ("SAR Calculation for Multi-channel MR Transmission Systems"), the entire disclosure of which is incorporated by reference.

RF excitation waveforms are applied to the RF coil 136 by the RF system 128 to perform a selected magnetic resonance pulse sequence. Responsive MR signals detected by the RF coil 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil 136 or to one or more local coils or coil arrays. As described below, the RF transmitter includes a plurality of transmission channels to produce RF pulses formed via the superimposition of the RF pulses generated by each transmission channel.

The RF system 128 also includes one or more RF receiver channels. Each RF receiver channel includes an RF amplifier that amplifies the MR signal received by the coil to which it is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals are typically used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices. Also, navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, or other visualization processes.

Images reconstructed by the data processing server 122 are conveyed back to the workstation 110 for storage. Real-time images may be stored in a database memory cache (not shown) from which they may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
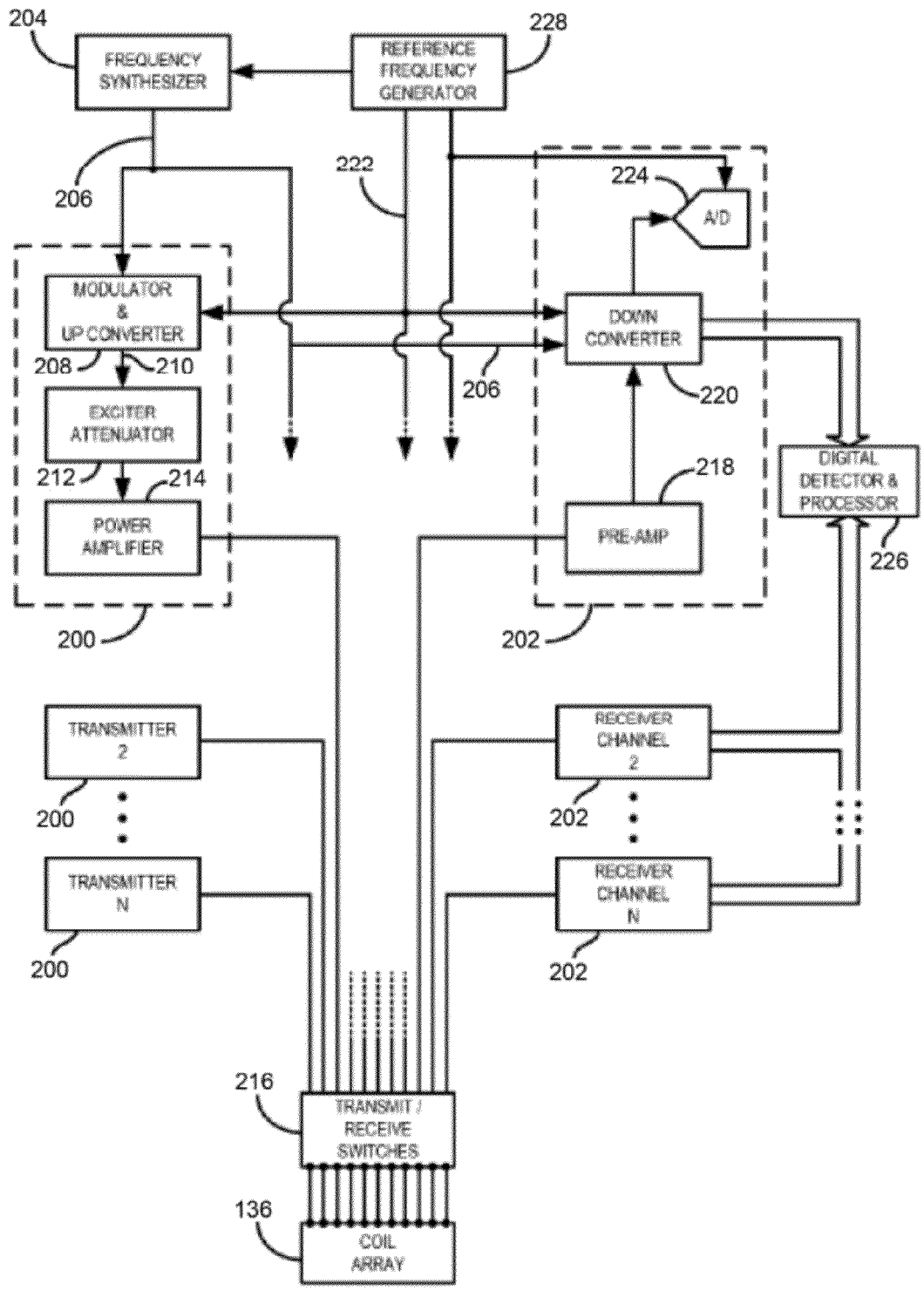
FIG. 2 is a block diagram of an RF system and other components of the MRI system of FIG. 1 to depict a parallel transmission architecture of the RF system.

Referring now to FIG. 2, the RF system 128 and other components of the system 100 are shown in greater detail. The whole body coil array 136 generally includes a plurality of coil elements that can be separately driven by a plurality of RF transmitters 200 to produce a desired RF field-of-excitation ("FOX"). Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to acquire the MR signals. A variety of different coil array structures may be used as part of the system 100 (FIG. 1).

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where its amplitude is modulated in response to a signal also received from the pulse sequence server 118. The signal defines the envelope of the RF excitation pulse to be produced and is generated by sequentially reading out a series of stored digital values. These stored digital values may, be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers are current source devices that connect to respective transmit inputs on a set of transmit/receive switches 216. In this example, a desired number N of the transmitters 200 are employed and connected through a corresponding number N of the transmit/receive switches 216 to a corresponding number N of the coil elements in the RF coil array 136.

The signal produced by the subject is picked up by the coil array 200 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital ("A/D") converter 224 which samples and digitizes the analog signal and applies it to a digital detector and signal processor 226, which produces 16-bit in-phase (I) values and 16-bit quadrature (Q) values corresponding to the received signal. The resulting stream of digitized I and Q values of the received signal are output to the data acquisition server 120 (FIG. 1). The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure.

When the $B_1$ field is not produced, the pulse sequence server 118 directs the transmit/receive switches 216 to connect each of the N receive channels to the respective N coil elements. Signals produced by the excited spins in the subject are picked up and separately processed as described above.

Figure 3:
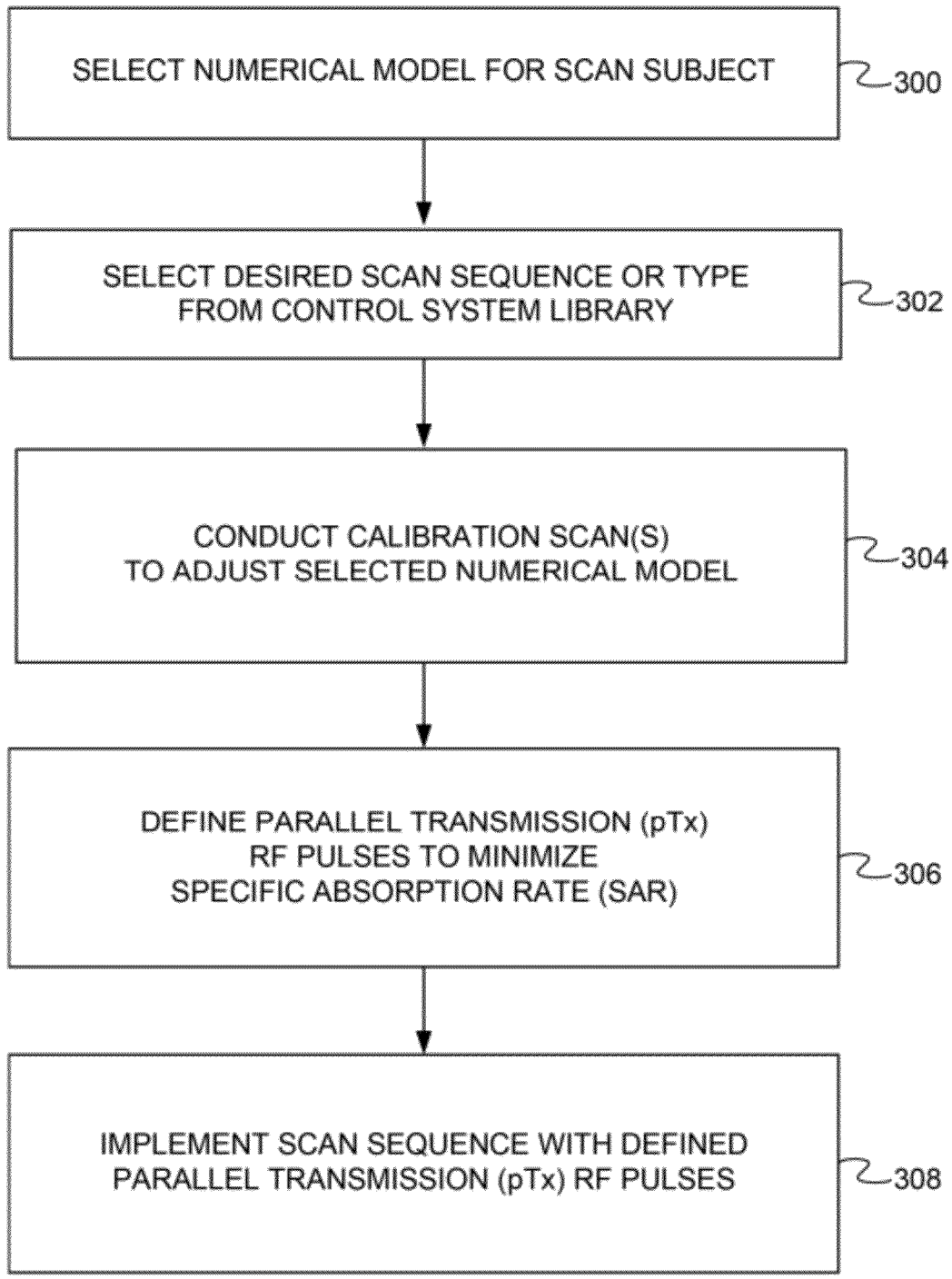
FIG. 3 is a flow diagram of one embodiment of a parallel transmission MRI method in accordance with one or more aspects of the disclosure.

FIG. 3 depicts one example of a pTx RF pulse design method in accordance several aspects of the disclosure. In the interest of tailoring the pulse design to a specific subject, the method may begin with a step 300 in which a numerical model is selected as a proxy for a scan subject. The numerical model may correspond with any model in the library of body models relied upon by MRI systems for a voxelized representation of the complex conductivity distribution presented by the human body. For example, the models available for selection may be those in the so-called "virtual family," which includes an average adult male model (Duke), an average adult female model (Ella), and other models for children, obese subjects, or other representations of a type of patient. Other commercially available models are also suitable for use with the disclosed methods, including, for instance, the HUGO model. Indeed, the disclosed methods are well suited for use with any numerical body model, model type, or model source. The selected model also need not be based on a pre-existing numerical model, but instead be generated via a set of comprehensive scans of the subject. The numerical model may be selected by an operator via an input interface provided by the workstation 110 (FIG. 1), which may, in turn, access data indicative of the numerical model stored in, for example, the mass storage unit 146 (FIG. 1). The manner in which one of the models is selected for use in connection with a particular subject may vary considerably.

In this example, the method next includes a step 302 in which a preliminary scan sequence is selected from a library of predetermined scan sequences made available by the control system 104 (FIG. 1). The library may include discrete scan sequences configured for respective clinical or diagnostic purposes. The scan sequence may be preliminary in the sense that it provides a general framework of the RF pulses to support the desired clinical or diagnostic purpose. The scan sequence may not include the details of each RF pulse. Alternatively, an operator may be provided with an option to customize the RF pulses of the scan sequence. In either case, the pTX RF pulse design methods described herein are then used to customize the scan sequence to minimize local SAR for the specific subject. The scan sequence selection may also be made by an operator using the workstation 110 (FIG. 1). The scan sequence library may also be stored on the mass storage unit 146 (FIG. 1) or any other storage medium of (or in communication with) one or more of the components of the control system 104 (FIG. 1). The scan sequence selection may alternatively be made at a different point in the process, in which case the step 302 may instead be directed to selecting some other context for the pulse design, including, for instance, the general type of scan (e.g., whole body or head), a body part to be scanned (e.g. arm), or a clinical purpose.

A calibration step 304 may be implemented after selection of the numerical model and the scan sequence (or scan type). The calibration step 304 is generally directed to adjusting the selected numerical model before the model is used for electric field calculations that support the RF pulse design. Generally speaking, each calibration scan provides feedback regarding the electric and magnetic fields produced in a tissue segment by the respective array elements of the system for a given pTx pulse. The calibration step 304 may include any number of scans, as desired, and may involve standard calibration techniques used with commercially available scanners used in typical clinical contexts. The calibration step 304 may be implemented before the selection of the scan sequence.

The calibration scan(s) are used to adjust the numerical model of the body based on the transverse magnetization resulting from the RF pulses applied during the calibration scan(s). Each calibration scan may involve any desired combination of the parallel transmit channels 200. The magnetization resulting from each scan is captured and processed by the RF system 128, the data acquisition server 120, and other components of the control system 104 in much the same manner as an RF pulse designed for clinical purposes. However, the data is instead used to improve the model's ability to predict the magnetic field generated in the subject's body resulting from a given RF pulse by incorporating or adjusting tissue properties such as conductivity, dielectricity, density, etc. In this way, the model may be adjusted to reflect anatomical or other differences of the specific subject relative to the numerical model that should be taken into account during RF pulse design. Calibration data, which may be indicative of, for instance, the calibration scan results or the adjustments to the model, may be stored in any server, device, component, or other unit of the control system 104 (FIG. 1).

After completion of the calibration scans, and once the numerical model has been adjusted for the specific subject and scan sequence, an RF pulse design step 306 is implemented to define and select an RF pulse that minimizes a design criterion representative of, among other things, local SAR within the subject. The RF pulse design step 306 may be performed on, for instance, the workstation 110 (FIG. 1), or any one or more components of the control system 104 (FIG. 1) in communication therewith. Further details regarding the procedure implemented by the workstation 110 in the step 306, such as the design criterion to be minimized, are set forth below in connection with FIGS. 4-6. Generally speaking, the RF pulse design selection and definition is based on minimizing a representation of maximum or peak local SAR either alone or in combination with one or both of the following additional factors: (i) a representation of the deviation from a desired magnetization, and (ii) a representation of non-local SAR via, for instance, total pulse power, global SAR, or average SAR. The relative strength or contribution of each one of these factors may be adjusted to customize the combination to be minimized. In this way, the peak local SAR component of the minimization may be emphasized to a greater or lesser extent relative to the contribution of for instance, total pulse power or global SAR.

Once the RF pulse is defined and selected, an operator may again use the workstation 110 (FIG. 1) or other operator interface to conduct a scan sequence in a step 308 that implements the pTx RF pulses defined in the step 306. Any number of pTx RF pulses may be defined and, thus, implemented during the scan. In some cases, one or more of the steps shown in FIG. 3 are repeated to support the definition of separate pTx RF pulses incorporated into a single scan sequence conducted in the step 308.

Figure 4:
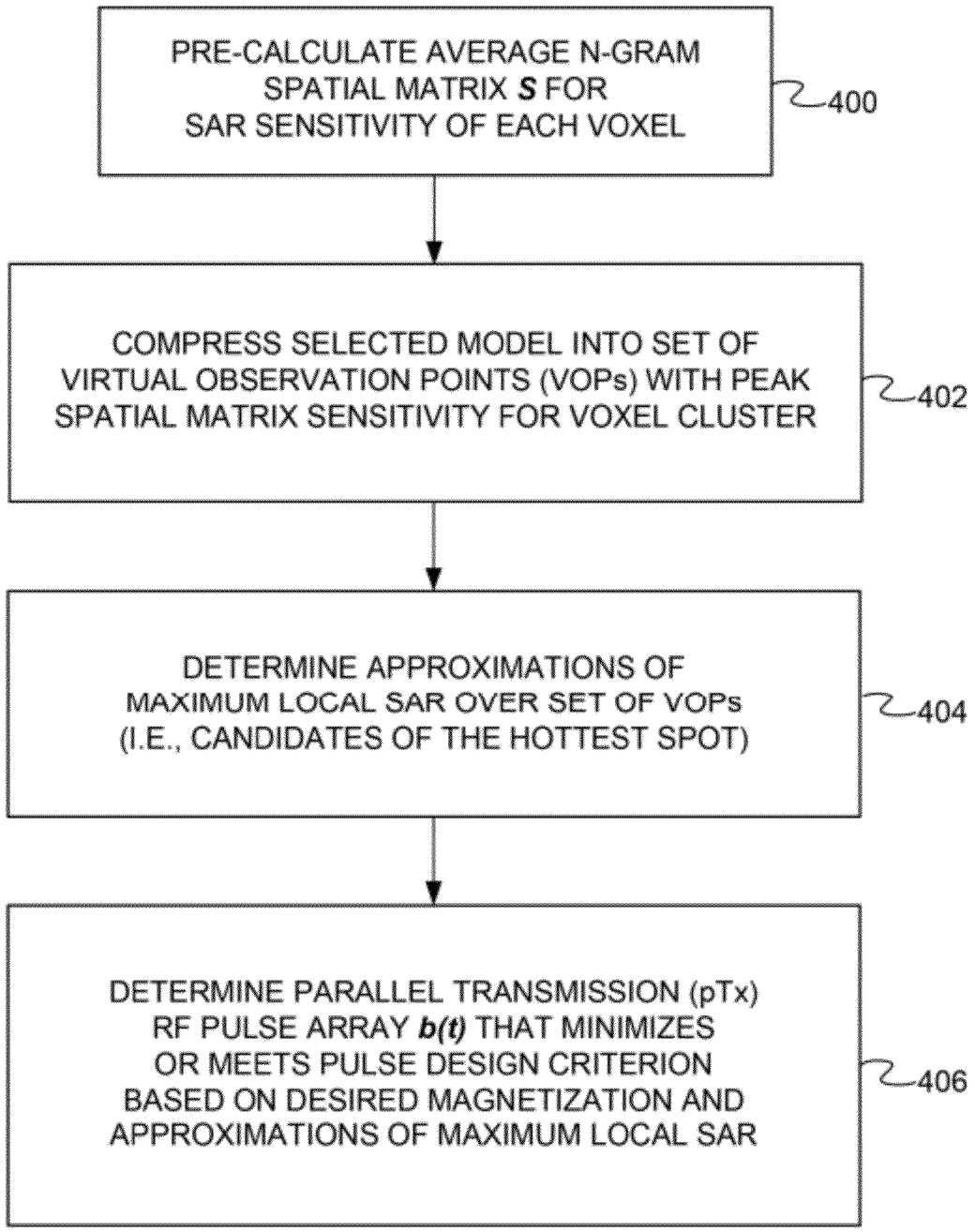
FIG. 4 is a flow diagram of a parallel transmission RF pulse design method in accordance with one or more aspects of the disclosure.

Further details regarding the pTx RF pulse design method are provided in connection with an example shown in FIG. 4. The exemplary method may begin in a step 400 with the pre-calculation of a representation of the electric field (or electric field absorption sensitivity) for each voxel, v, in the numerical model resulting from a unit RF signal input of 1 Volt of 10 us duration. These electric (and magnetic) field calculations may be implemented using a known technique, such as the Finite Difference Time Domain (FDTD) method. Generally speaking, the FDTD method provides a numerical simulation of the electric and magnetic fields. These simulations of the fields in a segmented tissue ultimately support the estimates of the local SAR (and, in some cases, global SAR) due to the RF pulses transmitted by the pTx coil array 136 (FIG. 2). In this case, the unit signal is applied via each individual coil in the array 136 to generate a spatial matrix S representative of the electric field absorbed by the voxel via each unit RF signal. More specifically, for any RF, b, the electrical field at a voxel, v, can be calculated as $E_v=Q_v b$, where the $k^{th}$ column of $Q_v$ is the pre-calculated electrical field vector due to a unit signal of channel k in voxel v. With the density, $\rho$, and the electric conductivity, $\sigma$, of, for instance, the brain model, local SAR at a voxel v can be determined by $$SAR_v = \sum_t SAR_v(t) = \sum_t \frac{\sigma_v}{2\rho_v} \|E_v(t)\|^2 = \sum_t b(t)' S_v b(t),$$

$$\text{where } S_v = \frac{\sigma_v}{2\rho_v} Q_v' Q_v.$$

In view of the foregoing relationship, the spatial matrix, S, is indicative of the sensitivity of a particular voxel to electric field absorption. The spatial matrix, S, does not incorporate the details of the RF excitation or any other temporal information. Instead, the spatial matrix, S, reflects the anatomy of the subject, the positioning of the RF coil(s), and other non-temporal, spatial parameters.

In this example, the pre-calculation of the fields and, thus, the spatial matrices $S_v$ for local SAR sensitivity representation, are generated and averaged for a volume of the numerical model surrounding each voxel v, i.e., an N-gram volume such as a 10 g volume. For N-gram SAR calculation, the fields in the N-gram region around the voxel v are pre-calculated using the FDTD technique, and the local SAR in the region may be averaged as follows:

$$SAR_{v,ngram} = \frac{\sum_{w \in Ngram_v} SAR_w}{|Ngram_v|} = \sum_t b(t)' \left( \frac{\sum_{w \in Ngram_v} S_w}{|Ngram_v|} \right) b(t) = \sum_t b(t)' S_{v,Ngram} b(t)$$

Further details regarding exemplary procedures for the pre-calculation of the spatial matrix S as an indication of SAR sensitivity are set forth in U.S. Patent Publication No. 2010/0308825 ("Method and Device for Selecting Body Model Positions for SAR Monitoring of a Magnetic Resonance Transmit Array"), and U.S. application Ser. No. 13/045,832 ("Method for Determining Sensitivity Matrices for Hotspots"), the entire disclosures of which are hereby incorporated by reference.

Upon completion of the pre-calculation of the spatial matrix for the absorption sensitivity of each voxel, the selected (and calibrated) model is compressed in a step 402 into a set of virtual observation points (VOPs). Generally speaking, all of the voxels in the model are collected and assigned into a cluster of voxels represented by one of the VOPs based on the spatial matrix S and, thus, the absorption sensitivity, of each voxel. The VOP of each voxel cluster is defined as, and generally establishes, a peak spatial matrix sensitivity to local SAR for all voxels in its voxel cluster.

In one exemplary model compression method, all the voxels in the human model are clustered into several sets of voxels. For each cluster, $C_j$, a positive semi-definite matrix $A_j$ is constructed such that $A_j \geq S_{v,Ngram}$ for any voxel v in the cluster $C_j$. Them the maximum N-gram SAR in the cluster $C_j$ is limited by an upper bound as follows:

$$\max_{v \in C_j} \sum_t b(t)' S_{v,Ngram} b(t) \leq \sum_t b(t)' A_j b(t)$$

In this example, the maximum local SAR to be used in the pTx pulse design is approximated as the upper bound $$\max_j \sum_t b(t)' A_j b(t).$$

If this upper bound is tighter (e.g., closer) to actual maximum local SAR in each cluster, then the approximation of the maximum local SAR is more correct, and the constraint of the disclosed pTx pulse design methods is closer to the maximum local SAR of all of the voxels in the model. By increasing the number of clusters, the upper bound can be tightened, but the complexity of the pulse design method is increased.

The clustering of the voxels in the model may proceed via an iterative, heuristic clustering procedure. The procedure may be initiated via the selection of an overestimation factor $\epsilon > 0$. In the jth iteration, the un-clustered voxel v in the model is determined such that the matrix $S_{v,Ngram}$ has the largest eigenvalue. This voxel is then considered the dominating voxel of the cluster $C_j$. The upper bound matrix $A_j$ is then defined as the following summation of the spatial matrix and the unit matrix scaled by the overestimation factor: $A_j = S_{v,Ngram} + \epsilon I$. The procedure then finds all the un-clustered voxels in the model limited by the upper bound matrix $A_j$ and assigns them to the cluster j. The foregoing steps are then iterated until all the voxels are clustered.

The overestimation factor $\epsilon$ may be considered a tuning factor of the clustering procedure and, more generally, the model compression method and pTx pulse design methods disclosed herein. By decreasing the overestimation factor $\epsilon$, the approximation of the maximum local SAR for each voxel cluster is tighter, and the number of voxel clusters is increased. Conversely, by increasing decreasing the overestimation factor $\epsilon$, the approximation of the maximum local SAR for each voxel cluster is less tight, and the number of voxel clusters is decreased.

Further details regarding exemplary model compression techniques involving a spatial matrix indicative of absorption sensitivity are set forth in the above-referenced publication and well-suited for use with the disclosed methods and systems.

Upon completion of the model compression step 402, the dominant local SAR regions are captured via the virtual observation points (VOPs), which serve as candidates of the hottest spot (or voxel) HV as follows:

$$\max_{v \in 3D} \left\{ \sum_t b(t)' S_{v,Ngram} b(t) \right\} \leq \max_{v \in HV} \left\{ \sum_t b(t)' (S_{v,Ngram} + \varepsilon I) b(t) \right\} =$$

$$\max_{v \in HV} \left\{ \sum_t b(t)' S_{v,Ngram} b(t) \right\} + \varepsilon \sum_t |b(t)|^2$$

The pTx pulse design methods disclosed herein may then define a minimization design criterion based on this principle regarding the maximum local SAR. The maximum local SAR for the VOPs is used as a component of the minimization design criterion. The minimization design criterion may include components other than the maximum local SAR component. In some cases, the minimization design criterion also includes a component representative of total pulse power. In fact, the overestimation factor described above results in the incorporation of a total pulse power component scaled thereby. One example of a design criterion to be minimized in accordance with the disclosed methods and systems is as follows:

$$\|m_d - m(b)\|_2^2 + \lambda \max_{v \in HV}\left\{\sum_t b(t)' S_{v,Ngram} b(t)\right\} + \lambda \varepsilon \sum_t |b(t)|^2$$

In this example, the design criterion is also attempted to minimize the difference between the target (or desired) magnetization profile ($m_d$) and the magnetization of the pTx pulse b(t) as well as the scaled representation of the pulse power. These additional constraints on the pulse design are incorporated as additional terms to be added to the maximum local SAR component. By reducing the number of candidates to be evaluated for the maximum local SAR component, the complexity of the design process is reduced, but the constraint becomes closer to a global power constraint.

In an alternative method, the pulse power component is replaced or modified to incorporate a representation of global or average SAR.

Notwithstanding the advantages of the model compression technique described above, minimizing the design criterion may be difficult within the time constraints of the MRI scan. To decrease the computational time involved, an approximation of one or more components of the design criterion, including at least the maximum local SAR term, is employed. The approximation determination is generally implemented in step 404 once the set of VOPs and, thus, the candidates for the hottest spot in the model, have been determined. The step 404 generally attempts to approximate the maximum local SAR for the set of VOPs in accordance with an iterative process described below. In one example, the maximum local SAR is approximated as a weighted average of the respective local SARs of the VOPs (or peak absorption sensitivities thereof, as represented by the spatial matrix, S) as follows:

$$\max_{v \in HV}\left\{\sum_t b(t)' S_{v,Ngram} b(t)\right\} \cong \sum_{v \in HV} \sum_t (b(t)' w_v S_{v,Ngram} b(t),$$

where $w_v$ are non-negative weighting factors whose sum is equal to one. Each weighting factor is applied to a respective one of the VOP spatial matrices. This approximation effectively converts the maximum norm constraint of the minimization criterion into a weighted two norm (power) constraint, a solution for which is computationally feasible using several commercially available or known pulse design methods. Please see, for example, Setsompop, K., et al., *Magnitude least squares optimization for parallel radio frequency excitation design demonstrated at 7 Tesla with eight channels*. Magn Reson Med, Vol. 59(4), p. 908-15 (2009), Setsompop, K., et al., *Parallel RF transmission with eight channels at 3 Tesla*. Magn Reson Med, Vol. 56(5), p. 1163-71 (2006), Grissom, W., et al., *Spatial domain method for the design of RF pulses in multicoil parallel excitation*. Magn Reson Med, Vol. 56(3), p. 620-9 (2006), and Gumbrecht R., et al. *Fast high-flip pTx pulse design to mitigate B1+ inhomogeneity using composite pulses at 7T.*, 18th Annual Meeting of ISMRM (2010). Using these pulse design methods to resolve the approximation constraint, the approximation is updated via the iterative process to effectively minimize design criterion.

With the weighting factors, the three-component design minimization criterion set forth in connection with example described above becomes the following weighted power constraint:

$$b_{opt}(t) = \arg \min_{b(t)}\left\{\|m_d - m(b)\|_2^2 + \lambda \sum_t b(t)'\left(\varepsilon I + \sum_v w_v S_{v,Ngram}\right)b(t)\right\}.$$

As shown above, the different weights are generally applied to the different VOPs for the given pulse. The optimal pTx pulse $b_{opt}(t)$ may then be determined via the iterative process that, generally speaking, designs the pulse that minimizes the weighted power constraint. With an RF pulse design, the iterative process generally includes the calculation of the local SAR for the VOPs (or candidates for the hottest spot). The weighting factors are then adjusted based on the calculated local SAR to arrive at a better approximation of the maximum local SAR. In one example, the weighting factors are updated through a gradient descent method. Further details regarding the iterative process are set forth below in connection with the exemplary embodiment of FIG. 6.

Using the weighted approximation, the iterations eventually arrive at a determination in a step 406 of a pTx RF pulse that minimizes or otherwise sufficiently meets the minimization design criterion.

Figure 5:
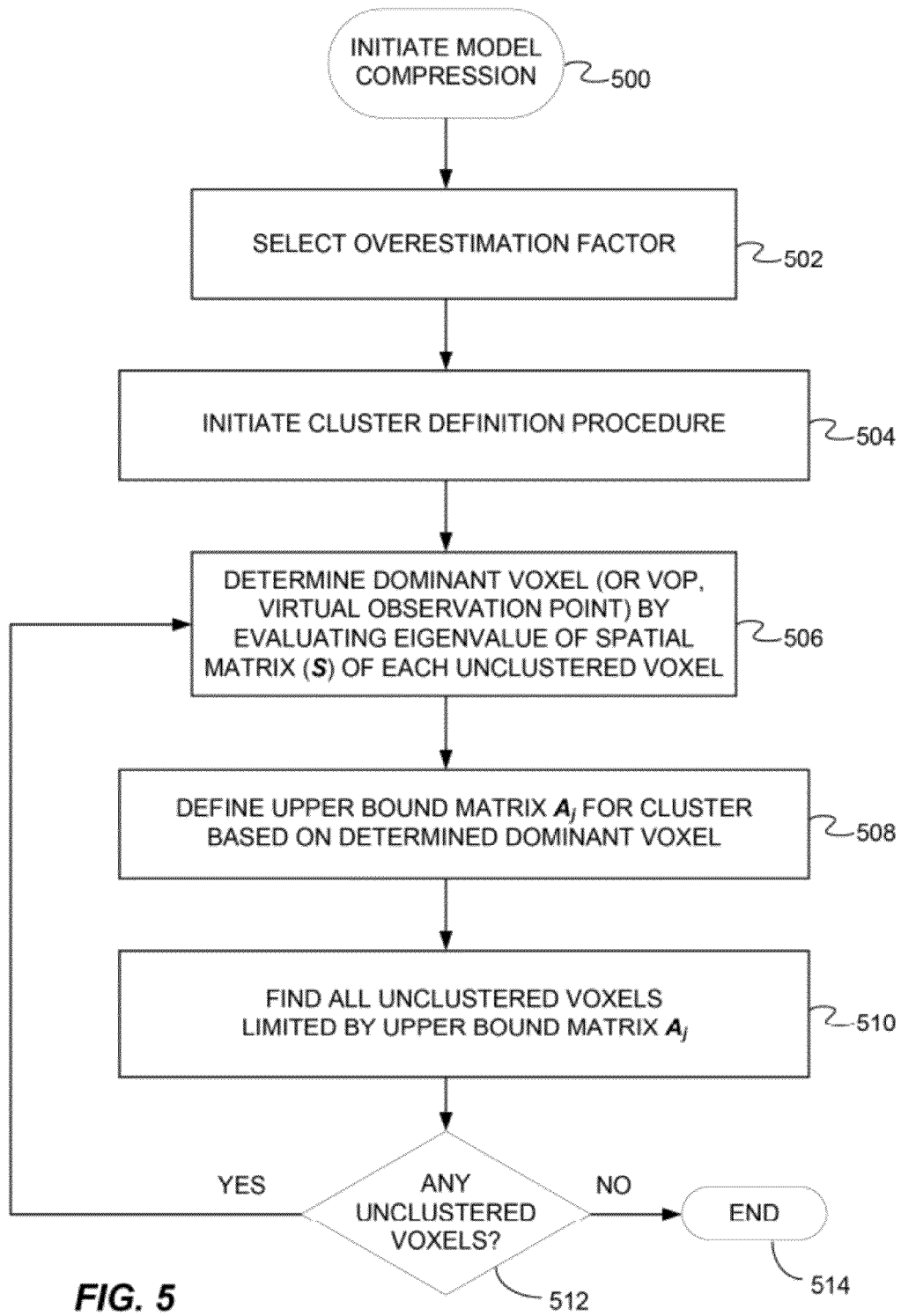
FIG. 5 is a flow diagram of an exemplary model compression method in accordance with one embodiment.

Turning now to FIG. 5, one example of a model compression method is initiated in a block 500, which is followed by a selection of an overestimation factor $\epsilon$ in a step 502 to tune the complexity or extent of the compression. Next, a cluster definition procedure is initiated in a step 504. As described above, the clusters are defined via an iterative process that determines in a step 506 the dominant voxel for each cluster of voxels in the model by evaluating the spatial matrix indicative of the absorption sensitivity of each voxel. To collect the voxels for each cluster, the upper bound matrix $A_j$ is defined in a step 508 based on the dominant voxel determined in the preceding step. Next, in a step 510, all of the un-clustered voxels in the model limited by the upper bound matrix $A_j$ are found and collected (or assigned) to the voxel cluster. A decision block 512 then determines whether any un-clustered voxels remain in the model. If so, control returns to the step 506 for the next iteration. If not, the model compression procedure is terminated with at a block 514.

Figure 6:
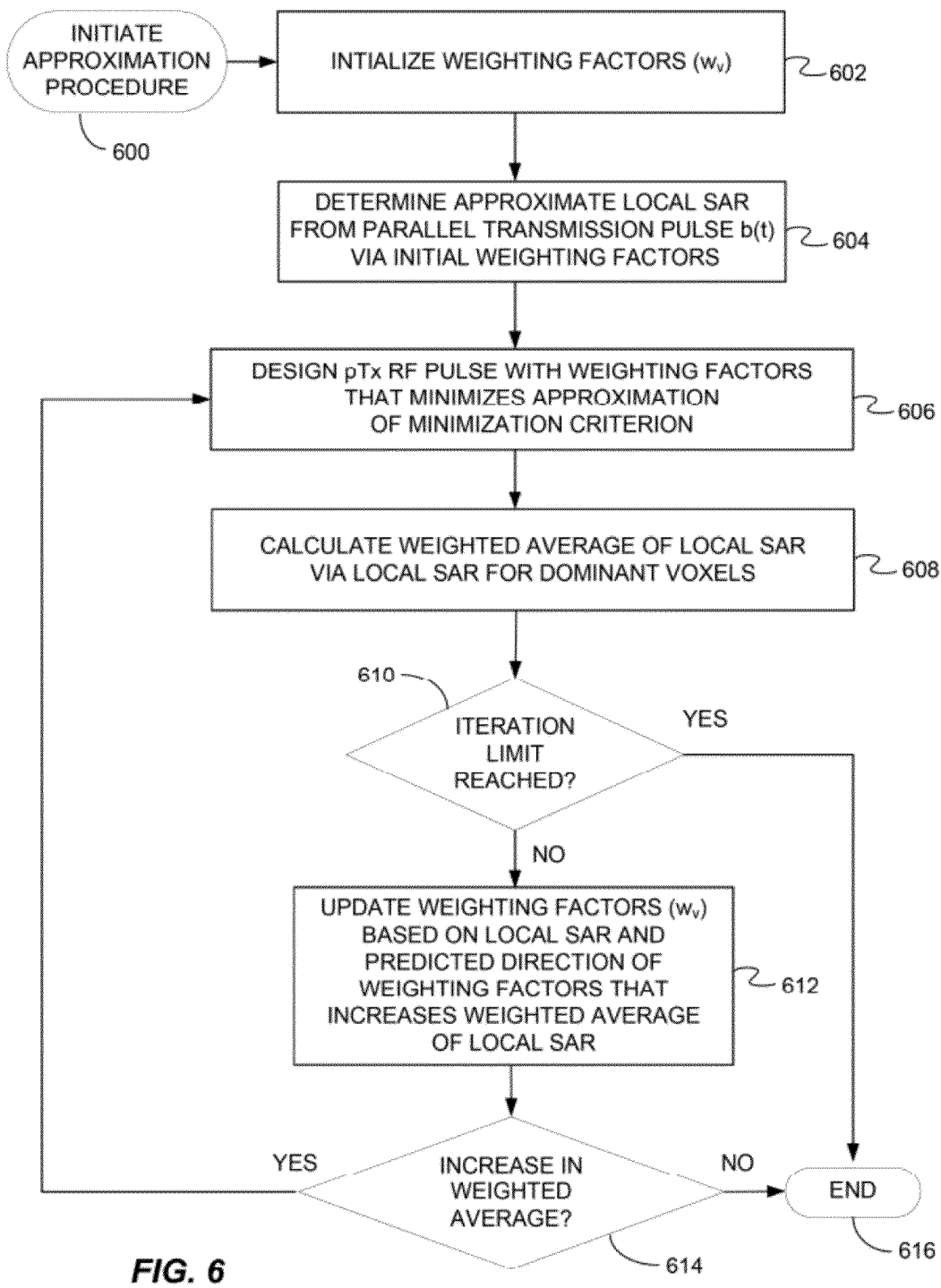
FIG. 6 is a flow diagram of an exemplary specific absorption rate (SAR) minimization criterion approximation method in accordance with one embodiment.

FIG. 6 depicts one example of an iterative weighted approximation procedure initiated in a block 600, which passes control to an initialization block 602 that initializes the set of weighting factors $w_v$. In one example, the weighting factors begin at the same value such that the each $w_v$=1/(the number of VOPs). A representation of the local SAR for each VOP may then be determined in a step 604 based on the initial weighting factors. Next, the pTx pulse is designed (or resolved) via the conventional pTx design algorithms evaluating the weighted power constraint described above that serves as the approximation of the minimization design criterion. Then (or as part of the implementation of the previous step), the weighted average of the local SAR is calculated via the local SAR values for each dominant voxel (i.e., VOP) in a step 608. This calculation will be used to update or adjust the weighting factors, provided that a predetermined iteration limit has not yet been exceeded. A decision block 610 determines if the iteration limit has been reached, before control passes to a step 612 that updates the weighting factors. Generally speaking, the weighting factors are updated based on the local SAR calculation and a predicted direction of each individual weighting factor that would increase the weighted average of the local SAR value. In one example, the step 612 uses the calculated local SAR for the VOPs to predict the direction of the weighting factors, $w_v$, that increases weighted local SAR. The weighting factors, $w_v$, may be updated to the direction with only a small change in each iterative step. A decision block 614 may then be used to confirm or otherwise determine if the weighted average local SAR did indeed increase as predicted. If not, control passes to a termination block 616 to stop the iterative procedure. If yes, then control returns to the step 606 for the design of the next pTx pulse that minimizes the approximation.

Figure 7:
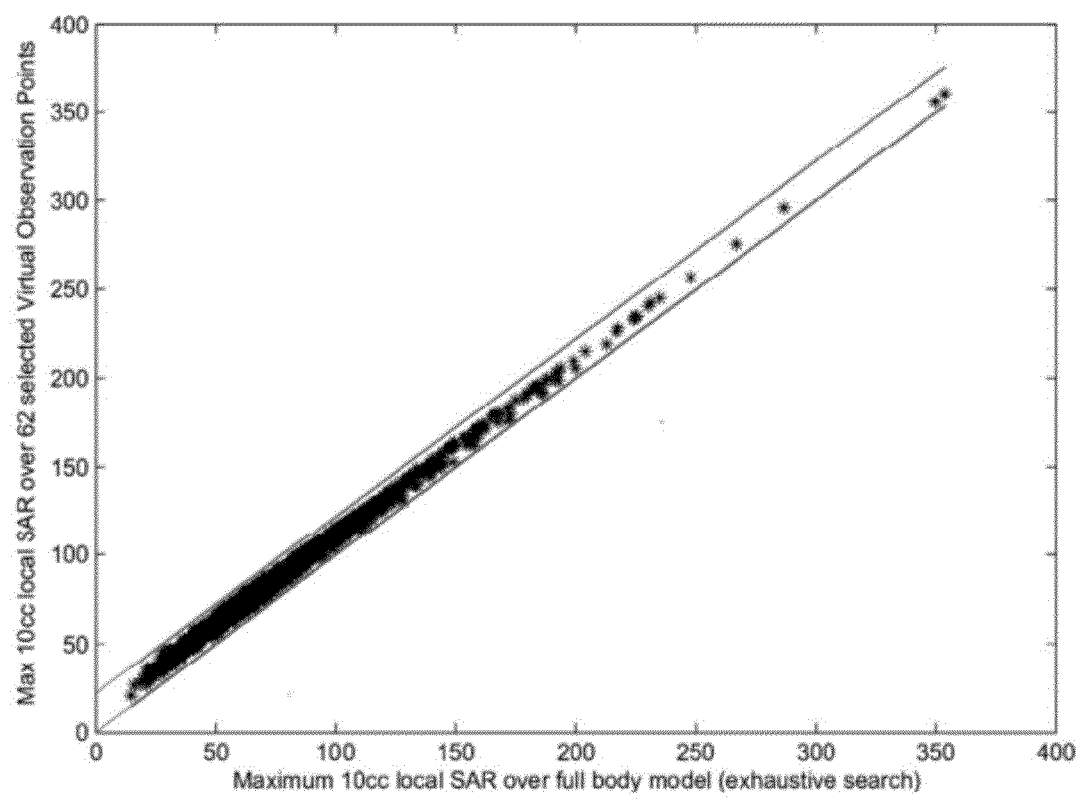
FIG. 7 is an example graphical plot comparing maximum local SAR for a set of virtual observation points (VOPs) defined via the model compression method of FIG. 5 with the maximum local SAR over the entire body model from which the VOPs were generated based on an exhaustive search of all voxels in the model.

With reference now to FIG. 7, the prediction quality of the virtual observation points for local SAR maxima may be indicated by comparison with an exhaustive search over the local SAR distribution over the full model. The 62 clusters resulting from the model compression are tested with 1000 signals U having random amplitudes and phases, with $\|U\|=1$. Results on the diagonal represent perfect predictions. Results below the diagonal are indicative of underestimation. Underestimation does not occur. The upper line indicates a limit for the overestimation which is considered acceptable.

Implementation of the above-described pTx pulse design methods may be tested via application of pulses to the virtual family model using an eight-channel pTx head system at 7T. The electric and magnetic fields are estimated by FDTD simulation. The head and the shoulder of the virtual family model are included in the simulation with a voxel size of 3 mm×3 mm×3 mm and a field of view of 62×44×47 cm$^3$, such that the number of voxels in the brain and shoulder of 271,950. With the electric field from the simulation, and given the conductivity and density profile of the model, as well as the pre-calculated 10-gram region, the spatial matrix, $S_{v,Ngram}$, representative of the absorption sensitivity is determined for each voxel in the model.

Figure 8:
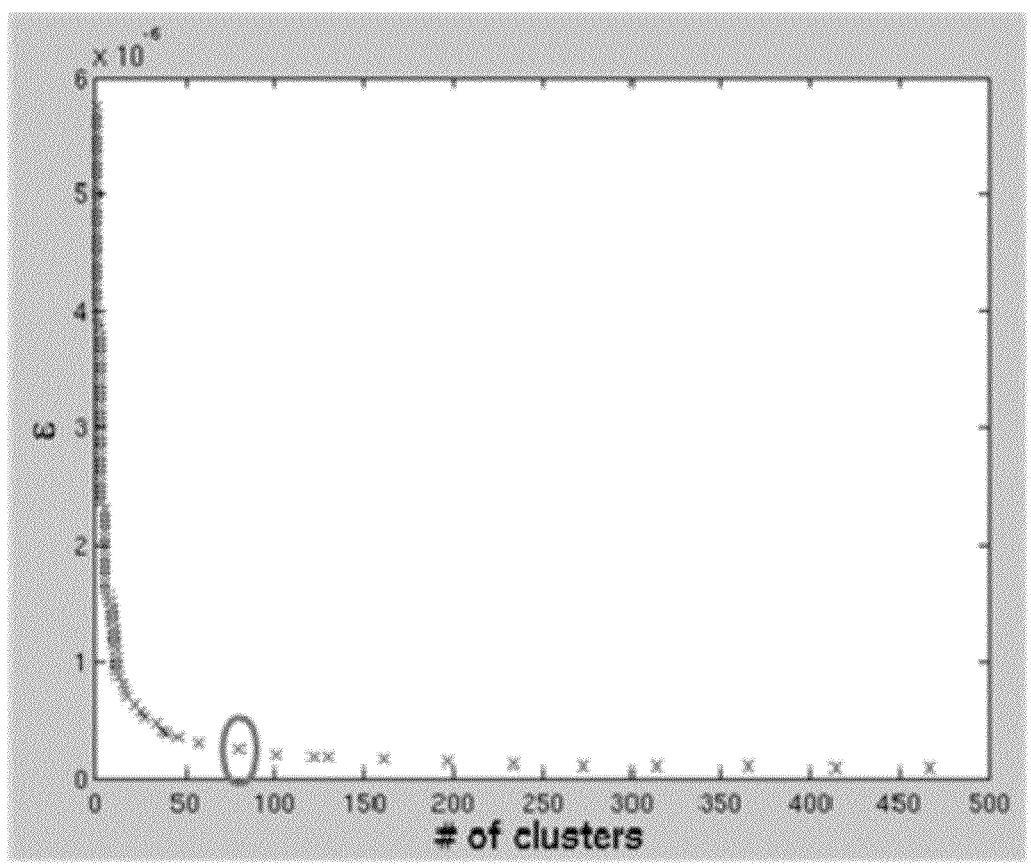
FIG. 8 is an example graphical plot depicting the number of clusters, or virtual observation points (VOPs) resulting from an overestimation or tuning factor of the model compression method of FIG. 5.

The above-described model compression method is implemented at several levels of complexity. FIG. 8 shows the number of VOPs, or candidates of hot spot, as a function of the overestimating factor. In exemplary embodiment, the overestimating factor resulting in 80 clusters is selected to cover all of the voxels in the model. The pTx pulses are then designed with the local SAR constraint approximated by the corresponding 80 upper bound matrices.

Figure 9:
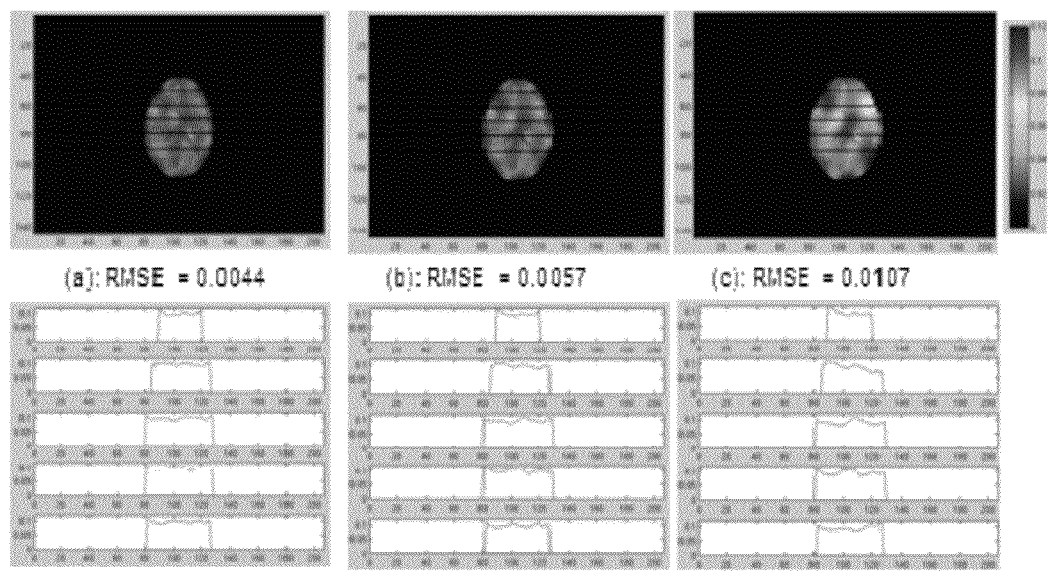
FIGS. 9 and 10 are example graphical plots of mitigated transmission profiles of local SAR constrained parallel transmission RF pulses of a two spoke and spiral designs, respectively.

To demonstrate the effectiveness of the disclosed pulse design methods, a pTx pulse for slice-selective excitation is designed with the slice thickness of 10 mm around the iso-center. The B1+ field is acquired by the FDTD simulation, with an assumed B0 inhomogeneity of zero. An MLS design is used with two spokes to mitigate the B1+ inhomogeneity. The desired magnetization profile is chosen to have a transverse magnetization of 0.1. Mitigated transmit profiles for three different levels of the root mean square error (RMSE) are shown in FIG. 9.

Figure 10:
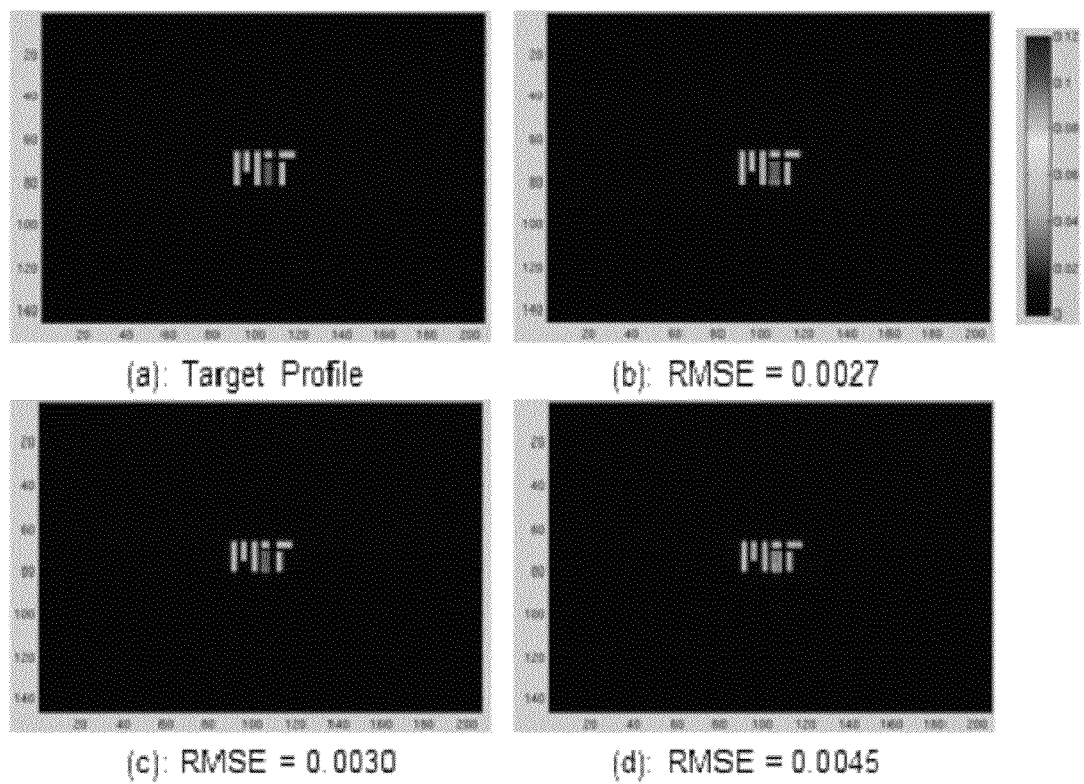

In another example, 2D spiral pTx pulse are designed for a target profile with an acceleration factor of four. The target profile and the mitigated profiles are shown in FIG. 10.

Figure 11A:
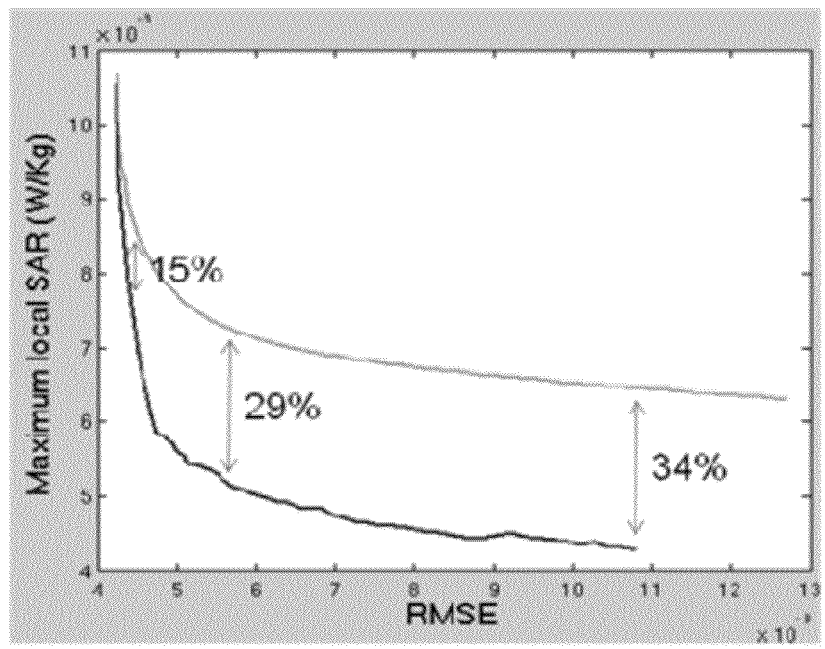
FIGS. 11A and 11B are example graphical plots depicting a reduction in maximum local SAR for a given root-mean-square error (RMSE) from a desired or target pulse magnetization profile.
Figure 11B:
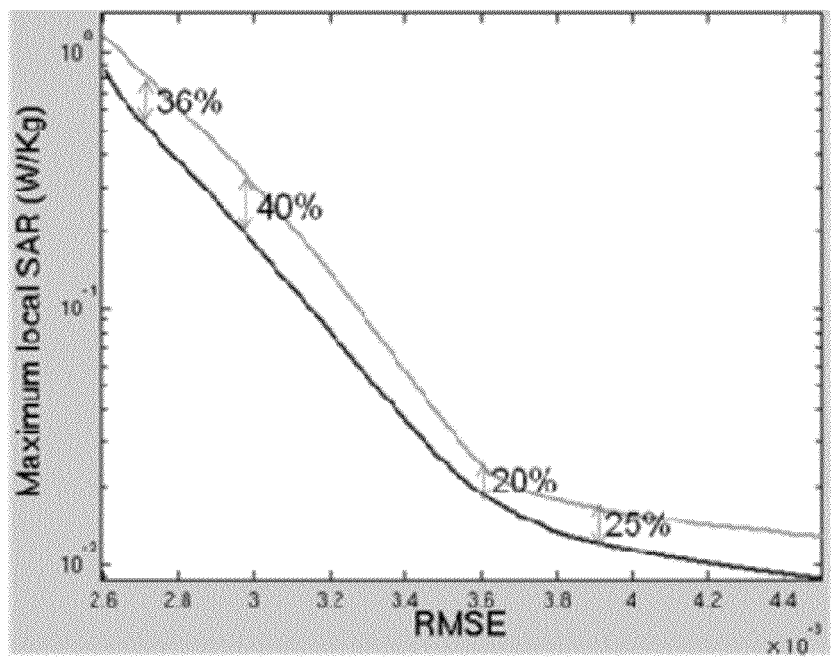

FIG. 11 shows a performance comparison with a different minimization criterion. Conventional MLS spoke and 2D spiral pTx pulses are designed with the following global power constraint:

$$\| m_d - |m(b)| \|_2^2 + \lambda_1 \sum_t |b(t)|^2$$

In both cases, RMSE of the simulated magnetization to the desired magnetization is calculated as well as the maximum local SAR in the entire voxels for several $\lambda$, $\lambda_1$. As shown in FIG. 11, for the MLS two spoke design, the design may reduce the maximum local SAR by 30% for two spoke and 20-40% for 2D spiral excitation compared to the conventional design.

The disclosed pulse design methods and systems may provide advantages and benefits relative to existing methods. In one set of examples, compared to existing global-SAR constrained designs, the disclosed method may reduce local SAR by 20-40%. The computation time in these cases for estimation of local SAR estimates via the hot voxel candidates (relative to an exhaustive search) may be reduced by a factor of 3000. In spite of these benefits, the above-described pulse design systems and methods present a technique that ensures that the maximum local SAR of a parallel transmission pulse does not exceed a dangerous threshold. As a result of the pulse design technique, the disclosed systems and methods present the additional advantage of designing a parallel transmission pulse with a less concentrated local SAR distribution.

The benefits of the disclosed SAR minimization techniques are also estimated with the Transient Solver in Microwave Studio simulation system in connection with the HUGO model for an eight-channel pTx body system at 3 Tesla over a 10 g volume. By the model compression technique described above, the dominant local SAR regions are captured by 36 virtual observation points. An RF pulse is designed with four spokes to mitigate $B_1^+$ inhomogeneity for an iso-center slice in the body model. After optimal selection of the RF pulse via the above-described weighted approximation technique, the maximum local SAR is decreased by 25-90% relative to designs using only global power constraints for a given mitigation performance level. The computation time of each iteration step in the approximation technique was generally the same as the computation time of a conventional MLS spoke design based on the global power constraints.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A method of configuring a magnetic resonance imaging (MRI) system for scanning with a parallel transmission radio frequency (RF) pulse, the method comprising:
    compressing a model for a subject to be scanned by the MRI system into a plurality of voxel clusters, each voxel cluster defining a virtual observation point with a peak sensitivity to local specific absorption rate (SAR) for the voxel cluster;
    defining the parallel transmission RF pulse based on an approximation of a minimization criterion having a local SAR component based on the peak sensitivity of each virtual observation point, the approximation comprising a weighted sum of local SAR values for the virtual observation points; and
    storing the parallel transmission RF pulse for use by the MRI system.

2. The method of claim 1, wherein the model comprises a number of voxels, and wherein compressing the model comprises:
    calculating a spatial matrix for each voxel of the model, the spatial matrix being indicative of absorption sensitivity;
    defining an upper bound matrix for each virtual observation point as a sum of the spatial matrix of the virtual observation point and a unit matrix scaled by an overestimation factor that tunes the compressing step.

3. The method of claim 2, wherein the minimization criterion includes a component indicative of total power of the parallel transmission RF pulse scaled by the overestimation factor.

4. The method of claim 2, further comprising selecting the overestimation factor.

5. The method of claim 1, wherein the model comprises a number of voxels, and wherein compressing the model comprises evaluating an eigenvalue of a spatial matrix for each voxel of the model, the spatial matrix being indicative of absorption sensitivity.

6. The method of claim 1, wherein defining the parallel transmission RF pulse comprises iterating the approximation of the minimization criterion.

7. The method of claim 1, wherein the approximation of the minimization criterion is based on a set of weighting factors.

8. The method of claim 7, wherein each weighting factor is applied to the peak sensitivity of a respective one of the virtual observation points.

9. The method of claim 7, wherein defining the parallel transmission RF pulse comprises updating the set of weighting factors based on local SAR values of the virtual observation points for a given RF pulse and a predicted direction that increases the local SAR values.

10. A method of configuring a magnetic resonance imaging (MRI) system in connection with a model for a subject to be scanned by the MRI system with a parallel transmission radio frequency (RF) pulse, the model being defined via a number of voxels, the method comprising:
    calculating a spatial matrix for each voxel of the model, the spatial matrix being indicative of absorption sensitivity;
    defining a plurality of clusters of the voxels in the model, each cluster having a virtual observation point representing a maximum sensitivity to local specific absorption rate (SAR) for each voxel in the cluster; and
    selecting, for use by the MRI system, the parallel transmission RF pulse that minimizes an approximation of a design criterion having a local SAR component based on the peak sensitivity of each virtual observation point, the approximation comprising a weighted sum of local SAR values for the virtual observation points.

11. The method of claim 10, wherein defining the plurality of clusters comprises defining an upper bound matrix for each virtual observation point as a sum of the spatial matrix of the virtual observation point and a unit matrix scaled by an overestimation factor that tunes the compressing step.

12. The method of claim 11, wherein the design criterion includes a component indicative of total power of the parallel transmission RF pulse scaled by the overestimation factor.

13. The method of claim 11, further comprising selecting the overestimation factor.

14. The method of claim 11, wherein defining the plurality of clusters comprises evaluating an eigenvalue of the spatial matrix for each voxel of the model.

15. The method of claim 11, wherein defining the parallel transmission RF pulse comprises iterating the approximation of the design criterion.

16. The method of claim 11, wherein the approximation of the design criterion is based on a set of weighting factors.

17. The method of claim 16, wherein each weighting factor is applied to the maximum sensitivity of a respective one of the virtual observation points.

18. The method of claim 11, wherein selecting the parallel transmission RF pulse comprises updating the set of weighting factors based on local SAR values of the virtual observation points for a given RF pulse and a predicted direction that increases the local SAR values.

19. A magnetic resonance imaging (MRI) system comprising:
    a data storage unit to store calibration data for a model for a subject to be scanned, the model having a number of voxels;
    a coil array for transmitting a parallel transmission radio frequency (RF) pulse to the subject; and
    a control system in communication with the data storage unit and the coil array and configured to select the parallel transmission RF pulse for transmission via the coil array;
    wherein the control system is configured to design the parallel transmission RF pulse to control local specific absorption rate (SAR) based on the model, a model compression in which the model is compressed into a plurality of clusters of the voxels of the model, each cluster defining a virtual observation point with a peak sensitivity to local SAR for the voxel cluster, and an approximation of a design criterion having a local SAR component based on the peak sensitivity of each virtual observation point, the approximation comprising a weighted sum of local SAR values for the virtual observation points.

20. The magnetic resonance imaging (MRI) system of claim 19, wherein the control system is configured to calculate a spatial matrix for each voxel of the model, the spatial matrix being indicative of absorption sensitivity, and further configured to define an upper bound matrix for each virtual observation point as a sum of the spatial matrix of the virtual observation point and a unit matrix scaled by an overestimation factor that tunes the compressing step.

21. The magnetic resonance imaging (MRI) system of claim 20, wherein the design criterion includes a component indicative of total power of the parallel transmission RF pulse scaled by the overestimation factor.

22. The magnetic resonance imaging (MRI) system of claim 19, wherein the control system is configured to evaluate an eigenvalue of a spatial matrix for each voxel of the model, the spatial matrix being indicative of absorption sensitivity.

23. The magnetic resonance imaging (MRI) system of claim 19, wherein the control system is configured to iterate the approximation of the design criterion.

24. The magnetic resonance imaging (MRI) system of claim 19, wherein the approximation of the design criterion is based on a set of weighting factors.

25. The magnetic resonance imaging (MRI) system of claim 24, wherein the control system is configured to apply each weighting factor to the peak sensitivity of a respective one of the virtual observation points.

26. The magnetic resonance imaging (MRI) system of claim 24, wherein the control system is configured to update the set of weighting factors based on local SAR values of the virtual observation points for a given RF pulse and further configured to predict a direction that increases the local SAR values.

\* \* \* \* \*